(12) United States Patent
Zagdoun et al.

(10) Patent No.: US 8,946,597 B2
(45) Date of Patent: Feb. 3, 2015

(54) METHOD FOR OBTAINING A HEATED GLAZING

(75) Inventors: Georges Zagdoun, La Garenne Colombes (FR); Pierre Chaussade, Orleans (FR); Vincent Legois, Germigny des Pres (FR)

(73) Assignee: Saint-Gobain Glass France, Courbevoie (FR)

( * ) Notice: Subject to any disclaimer, the term of this patent is extended or adjusted under 35 U.S.C. 154(b) by 303 days.

(21) Appl. No.: 13/029,385

(22) Filed: Feb. 17, 2011

(65) Prior Publication Data

US 2011/0198334 A1      Aug. 18, 2011

(30) Foreign Application Priority Data

Feb. 17, 2010 (FR) .................... 10 51140

(51) Int. Cl.
| | |
|---|---|
| B60L 1/02 | (2006.01) |
| H05B 3/16 | (2006.01) |
| C23C 14/08 | (2006.01) |
| C03C 17/23 | (2006.01) |
| C23C 14/34 | (2006.01) |
| H05B 3/84 | (2006.01) |

(52) U.S. Cl.
CPC ............. *C23C 14/086* (2013.01); *C03C 17/23* (2013.01); *C23C 14/34* (2013.01); *H05B 3/84* (2013.01); *C03C 2217/94* (2013.01); *C03C 2218/32* (2013.01); *H05B 2203/017* (2013.01); *Y02T 50/67* (2013.01)

USPC .......................................... 219/203; 219/543

(58) Field of Classification Search
USPC .......... 219/203, 520–522, 541–544, 546–548
See application file for complete search history.

(56) References Cited

U.S. PATENT DOCUMENTS

| | | | | | |
|---|---|---|---|---|---|
| 2,569,773 | A | * | 10/1951 | Orr ............................... | 219/543 |
| 2,932,710 | A | * | 4/1960 | Coale et al. .................... | 219/547 |
| 3,411,203 | A | * | 11/1968 | Pakulski et al. ................. | 29/620 |
| 3,781,524 | A | * | 12/1973 | Levin ............................ | 219/522 |
| 4,443,691 | A | * | 4/1984 | Sauer ........................... | 219/522 |
| 2007/0284342 | A1 | * | 12/2007 | Jorgensen ............... | 219/121.36 |

* cited by examiner

*Primary Examiner* — Sang Y Paik
(74) *Attorney, Agent, or Firm* — Oblon, Spivak, McClelland, Maier & Neustadt, L.L.P.

(57) ABSTRACT

The subject of the invention is a method of obtaining a heated window, comprising
- depositing a continuous thin film of a transparent electronically conductive oxide, having a sheet resistance that is uniform over the entire area of the film, on a glass sheet; and
- subjecting the thin film to a plasma treatment in which a device that emits excited species of an oxygen plasma is placed facing a region of the thin film, and then a relative movement is created between the thin film and the device in order to treat differentially the various regions of the thin film, so that after the thin film has been treated it has regions with different sheet resistances.

15 Claims, 5 Drawing Sheets

METHOD FOR OBTAINING A HEATED GLAZING

BACKGROUND OF THE INVENTION

1. Field of the Invention

The invention relates to the field of heated windows, especially those used in aircraft.

2. Description of the Background

Heated windows generally comprise at least one glass sheet coated with one or more transparent electronically conductive films. Conductive strips located on at least two opposite sides of the window allow a current to flow within the film, generating heat by the Joule effect, which heat is useful for de-icing and/or de-misting the window.

Transparent electronically conductive films are generally based on metals, in particular silver, or oxides (called TCOs), especially indium tin oxide (ITO).

Far from being square or rectangular, heated windows, especially those used in aircraft, sometimes have complex shapes; this may especially be a trapezoidal or pentagonal shape. As a result, for electronically conductive films of uniform sheet resistance, i.e. that have a sheet resistance that is substantially identical from one region of the film to another, the electrical power density may become very non-uniform, especially varying by a factor of 4 or 5 depending on the region of the window. The heating intensity is therefore very dependent on the region of the window.

One solution to this problem consists in locally modulating the sheet resistance of the thin electronically conductive film in order to obtain different sheet resistances for different regions of the window. Optimized sheet resistance maps may thus be calculated.

To actually produce such maps, it has been proposed to modulate locally the thickness of the thin electronically conductive film by modifying its deposition conditions. More precisely, when the film is deposited by magnetron sputtering, it has been proposed to place automatically controlled moveable masks between the glass sheet and the cathode. Creating regions with different thicknesses, and therefore with different sheet resistances, allows uniform or substantially uniform electrical power densities to be obtained over the entire area of the heated window.

This solution is, however, not without drawbacks: the deposition time is prolonged, mask maintenance requires the deposition equipment to be stopped and residues deposited on the masks can contaminate the surface of the films, reducing the yield of the method. Furthermore, the thin-film deposition conditions must be finely tailored to each window geometry.

SUMMARY OF THE INVENTION

One aim of the present invention is to remove these drawbacks by providing a method of obtaining a heated window, comprising the following steps:
- a continuous thin film of a transparent electronically conductive oxide, having a sheet resistance that is uniform over the entire area of the film, is deposited on a glass sheet; and
- said thin film is subjected to a plasma treatment in which a device that emits excited species of an oxygen plasma is placed facing a region of said thin film, and then a relative movement is created between said thin film and said device in order to treat differentially the various regions of said thin film, so that after said thin film has been treated it has regions with different sheet resistances.

Another subject of the invention is a heated window, especially obtained by the method according to the invention, comprising at least one glass sheet coated with a continuous thin film of a transparent electronically conductive oxide, of uniform thickness and having regions with different sheet resistances.

DETAILED DESCRIPTION OF THE INVENTION

Figure 1:
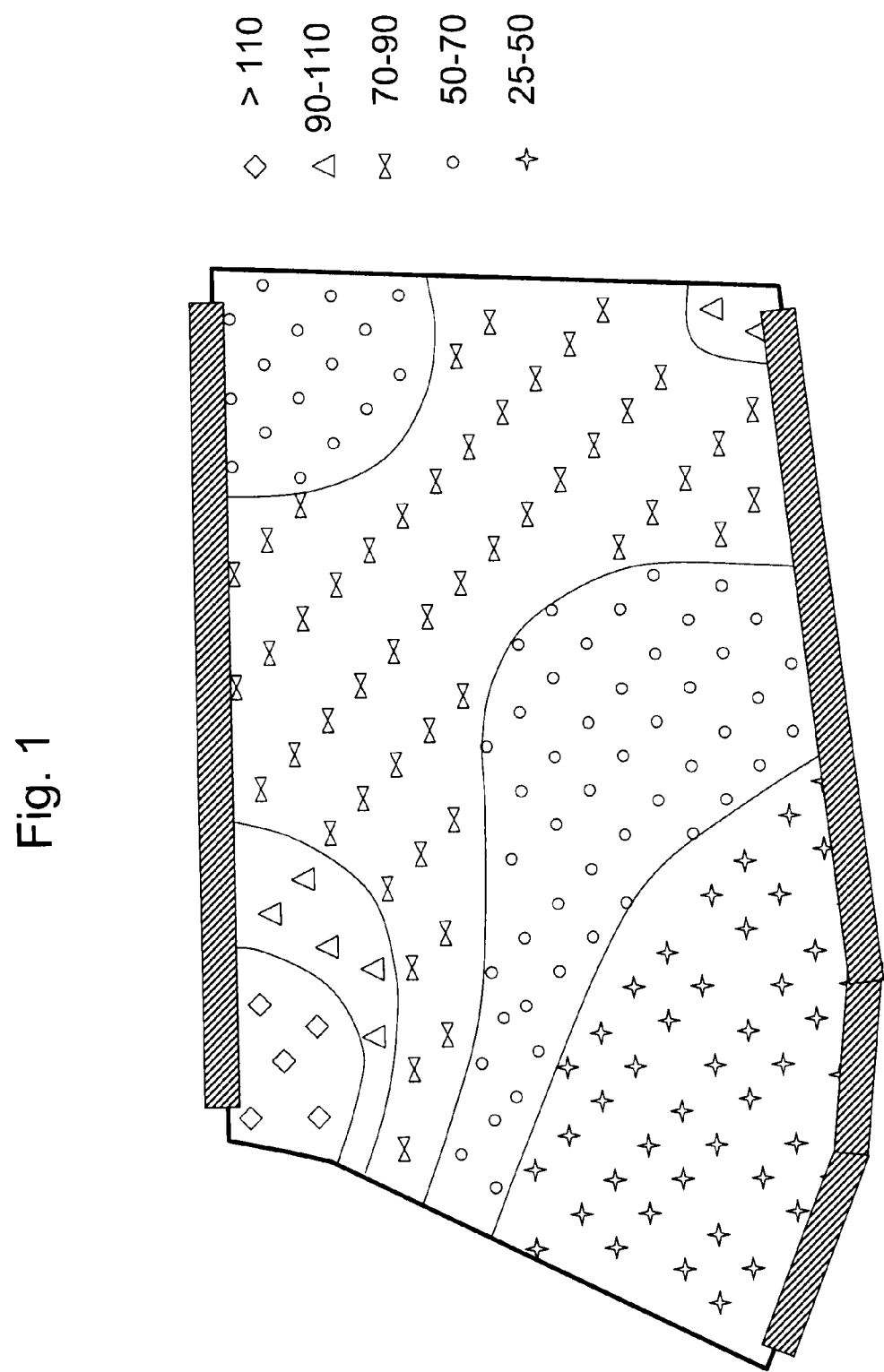
FIG. 1 is a diagram, of an airplane window, in which the electrical power densities (in $W/dm^2$) obtained in the case of a film with uniform sheet resistance are indicated.

Thus, the present invention provides a method of obtaining a heated window, comprising:
- depositing a continuous thin film of a transparent electronically conductive oxide, having a sheet resistance that is uniform over the entire area of the film, on a glass sheet; and
- subjecting the thin film to a plasma treatment in which a device that emits excited species of an oxygen plasma is placed facing a region of said thin film, and then a relative movement is created between the thin film and the device in order to treat differentially the various regions of the thin film, so that after the thin film has been treated it has regions with different sheet resistances.

The expression "oxygen plasma" is understood to mean a plasma obtained using an oxygen-containing gas. This gas may be oxygen or preferably air.

The plasma device, also called a plasma torch, generally consists of a body, within which a high-voltage discharge is created between two electrodes, and a nozzle. The plasma feed gas, generally air, is fed through the discharge zone and then the plasma created is expelled through the nozzle in order to reach the surface to be treated.

The interaction between the active species of the oxygen plasma (ions, free electrons, radicals, molecular fragments, etc.) and the thin electronically conductive film increases locally the resistivity of the film, probably via an oxidation effect, and therefore increases its sheet resistance without modifying its thickness.

By moving the device (or the glass sheet) and by modulating the plasma treatment depending on the regions treated, it is possible to obtain regions of differing sheet resistance without the drawbacks of the method proposed above. This is because, before the thin film has been treated, it generally has a uniform thickness over its entire area, thereby simplifying considerably the conditions of its deposition and especially enabling rapid deposition with a very high yield.

The treatment is preferably carried out at atmospheric pressure.

The transparent electronically conductive oxide is preferably chosen from indium tin oxide (ITO), aluminium- or gallium-doped zinc oxide and fluorine- or antimony-doped tin oxide.

The indium tin oxide preferably contains between 5 and 10 at % of tin. The fluorine-doped tin oxide preferably contains between 2 and 5 at % of fluorine. In the case of aluminium-doped zinc oxide, the dopant concentration (i.e. the weight of aluminium oxide relative to the total weight) is preferably lower than 3%. In the case where gallium is the dopant, the dopant concentration may be higher, typically between 5 and 6%.

In order to achieve the desired sheet resistances, the film is preferably between 40 and 1250 nm thick, especially between 100 and 500 nm and even between 150 and 400 nm thick.

Before the film has been treated, its sheet resistance is preferably between 2 and 50 ohms, especially between 10 and 20 ohms.

The glass sheet is preferably thermally or chemically tempered and retains its properties due to the tempering after the plasma treatment. A tempered glass sheet is characterized by high, compressive stresses at each of its surfaces. These high stresses increase the strength of the glass sheet, which may better withstand impacts. Many windows must be tempered for reasons associated with safety, but heating the glass causes the stresses to become uniformly distributed throughout the thickness of the glass, the beneficial effects of tempering being lost ("detempering" then being spoken of). The plasma treatment according to the invention has the advantage of not substantially heating the glass sheet, thus preventing any detempering.

Thermal tempering consists in heating the glass, and then abruptly cooling it using powerful gas jets. In the chemical tempering process, an ion exchange is performed in a bath of molten salts, by which exchange certain ions in the glass sheet (typically sodium ions) are replaced, at the surface, by larger ions (typically potassium ions).

The glass sheet may be composed of a soda-lime-silica glass, or else a borosilicate or aluminium borosilicate glass. Preferably, in particular when the glass sheet is chemically tempered or must be chemically tempered, its composition conforms with the teaching of patent application WO 98/46537 and comprises the following constituents, in the wt % ranges given below:

$SiO_2$ 55-71%
$Al_2O_3$ >2%
MgO 4-11% and >8% if $Al_2O_3$<5%
$Na_2O$ 9-16.5%
$K_2O$ 4-10%

The thickness of the glass sheet is typically between 2 and 12 mm, even between 3 and 6 mm, especially between 3 and 4 mm. The area of the glass sheet is preferably between 0.1 and 5 $m^2$, especially between 0.5 and 2 $m^2$.

The compressive stresses at the surface of the chemically tempered glass sheets typically vary from 200 to 500 MPa.

Several alternative or cumulative means allow the various regions of the thin film to be differentially treated. Preferably at least one parameter, chosen from the following, is varied:
1. the distance between the thin film and the plasma device;
2. the speed of relative movement between the thin film and the plasma device;
3. the number of passes of the device facing said thin film;
4. the electrical power of the plasma device;
5. the flow rate of plasma feed gas; and
6. the concentration of oxygen in the plasma feed gas.

Reducing the distance between the plasma device and the thin film, or reducing the speed of relative movement, or else increasing the number of passes of the device, the power of the plasma torch, the flow rate of the plasma feed gas or the concentration of oxygen in the plasma allows the intensity of the treatment to be increased, and therefore the sheet resistance to be locally increased. Each of the aforementioned six parameters may be used alone or in combination with one or more of the other parameters. For example, the following parameter combinations may be used: 1+2, 1+3, 1+4, 1+5, 1+6, 1+2+3, 1+2+4, 1+2+5, 1+2+6, 1+3+4, 1+3+5, 1+3+6, 1+4+5, 1+4+6, 1+2+3+4, 1+2+3+5, 1+2+3+6, 1+3+4+5, 1+3+4+6, 1+4+5+6, 1+2+3+4+5, 1+2+3+4+6, 1+2+3+5+6, 2+3, 2+4, 2+5, 2+6, 2+3+4, 2+3+5, 2+3+6, 2+4+5, 2+4+6, 2+5+6, 2+3+4+5, 2+3+4+6, 3+4, 3+5, 3+6, 3+4+5, 3+4+6, 3+5+6, 3+4+5+6, 4+5, 4+6, 4+5+6, 5+6.

For the sake of simplicity, the glass sheet is preferably stationary and the device emitting excited species of an oxygen plasma can move in three dimensions, said device being automatically controlled so that it is possible to adjust the distance z between the nozzle of the device emitting excited species of an oxygen plasma and the thin film and/or the speed of movement of the device emitting excited species of an oxygen plasma in the x-y plane of the glass sheet. The automatic control is programmed to obtain the desired sheet resistance map. The distance z, to be adjusted depending on the power of the plasma, preferably varies between 1 and 10 mm, especially between 2 and 5 mm or even between 3 and 5 mm. The speed of movement in the x-y plane is also adjusted depending on the power of the plasma. It typically varies between 1 cm/s and 1 m/s, especially between 10 and 50 cm/s.

The electrical power of the plasma device is preferably between 1000 and 5000 W. The power density (power delivered to the treated surface at a given moment) is typically between 100 and 600 W/$cm^2$.

After plasma treatment, the ratio of the sheet resistance of the most resistive region to the sheet resistance of the least resistive region is preferably between 2 and 30. It is, in particular, preferably 4 or more or even 10.

After plasma treatment, the sheet resistance preferably varies in a range between 5 and 100 ohms, especially between 15 and 60 ohms, depending on the region.

Preferably, the resolution of the process is lower than or equal to 10 $cm^2$, even 8 $cm^2$. The expression "resolution of the process" is understood to mean the area of the smallest region the sheet resistance of which can be different from that of the adjacent regions. Resolutions this high allow the modulation of the sheet resistance to be very finely adjusted and the uniformity of the electrical power density within the heating film to be optimized.

The transparent, thin electronically conductive film is preferably deposited by magnetron sputtering. For example, the indium tin oxide film may be obtained on a substrate heated typically to between 200 and 300° C. using an indium tin oxide target in an argon plasma. Alternatively, the substrate may be unheated and the target may be a metal target, made of an alloy of tin and indium, in an argon and oxygen plasma.

Other deposition methods may also be used, although they are less preferred: these may especially be evaporation or chemical vapour deposition (CVD) methods. In the latter method a gaseous organometallic precursor of the film to be formed is brought near to the glass sheet; it then decomposes under the effect of heat or under the effect of a plasma (PECVD or APPECVD methods). The fluorine-doped tin oxide film may for example be obtained by CVD using monobutyltin trichloride and trifluoroacetic acid.

Another subject of the invention is the use of the heated window, according to the invention, as an airplane window. This may especially be a windscreen. Of course, other applications in the field of rail transportation or terrestrial transportation (cars) are possible. The heating film is especially used to de-ice and/or de-mist the window, which typically requires electrical power densities of about 70 W/dm$^2$ in the case of de-icing, and 15 to 30 W/dm$^2$ in the case of de-misting.

The heated window according to the invention or obtained according to the invention preferably comprises three glass sheets secured to one another by two lamination interlayers made of transparent plastic, typically polyvinyl butyral (PVB) or polyurethane (PU). The external glass sheet, the one in contact with the exterior of the vehicle, especially of the airplane, will be called "sheet 1", the intermediate sheet "sheet 2" and the glass sheet located in contact with the interior of the vehicle "sheet 3". Typically, sheet 1 is thermally tempered and about 3 mm thick. Typically, sheet 2 is chemically tempered and about 5 to 6 mm thick.

In such a structure, the glass sheet coated with an electronically conductive film, treated according to the invention, is generally sheet 1, the electronically conductive film being positioned on side 2 of the window, i.e. facing the first lamination interlayer. Such a film is generally used to de-ice the window. The heated window may also comprise other glass sheets coated with thin electronically conductive films treated according to the invention. Thus sheet 2 may also be coated with an electronically conductive film treated according to the invention, positioned on side 3 or 4 of the window. Alternatively or cumulatively, sheet 3 may be coated with an electronically conductive film treated according to the invention, positioned on side 5 of the window. Each of these films will generally be used to de-mist the window.

The method according to the invention is therefore implemented on one, two or three of the glass sheets of the final window.

The method according to the invention therefore preferably comprises, before the thin electronically conductive film has been deposited and treated with an oxygen plasma, one or more of the following steps, which those skilled in the art will know how to implement:
- the glass sheet is cut to the desired dimensions and the edges are finished;
- electrical wires are deposited, especially by screen printing a conductive silver-based enamel, then a thermal temper is carried out (in this case, the conductive enamel is baked during this step); or
- a chemical temper is carried out, followed by deposition of the electrical wires, especially by screen printing a conductive silver-based enamel, said enamel then being baked.

The electrical wires are generally 5 to 10 mm wide strips deposited a few millimeters from the edges of the window, on at least two opposite sides of the window.

The method according to the invention therefore preferably comprises, after the thin electronically conductive film has been deposited and treated with an oxygen plasma, one or more of the following steps, which those skilled in the art will know how to implement:
- the glass sheet is joined to two other sheets, at least one of which may also have been treated according to the invention. The sheets are joined in a known way by baking in an autoclave; and
- the periphery is encapsulated using one or more seals, for example made of silicone, optionally reinforced with metal strips.

The seals preferably have rims fitted over the external surface of sheets 1 and 3 of the window, thus allowing the electrical wires to be hidden. The final window may then be inserted into a rebate.

FIG. 1 is a diagram, of an airplane window, in which the electrical power densities (in W/dm$^2$) obtained in the case of a film with uniform sheet resistance are indicated.

Figure 2:
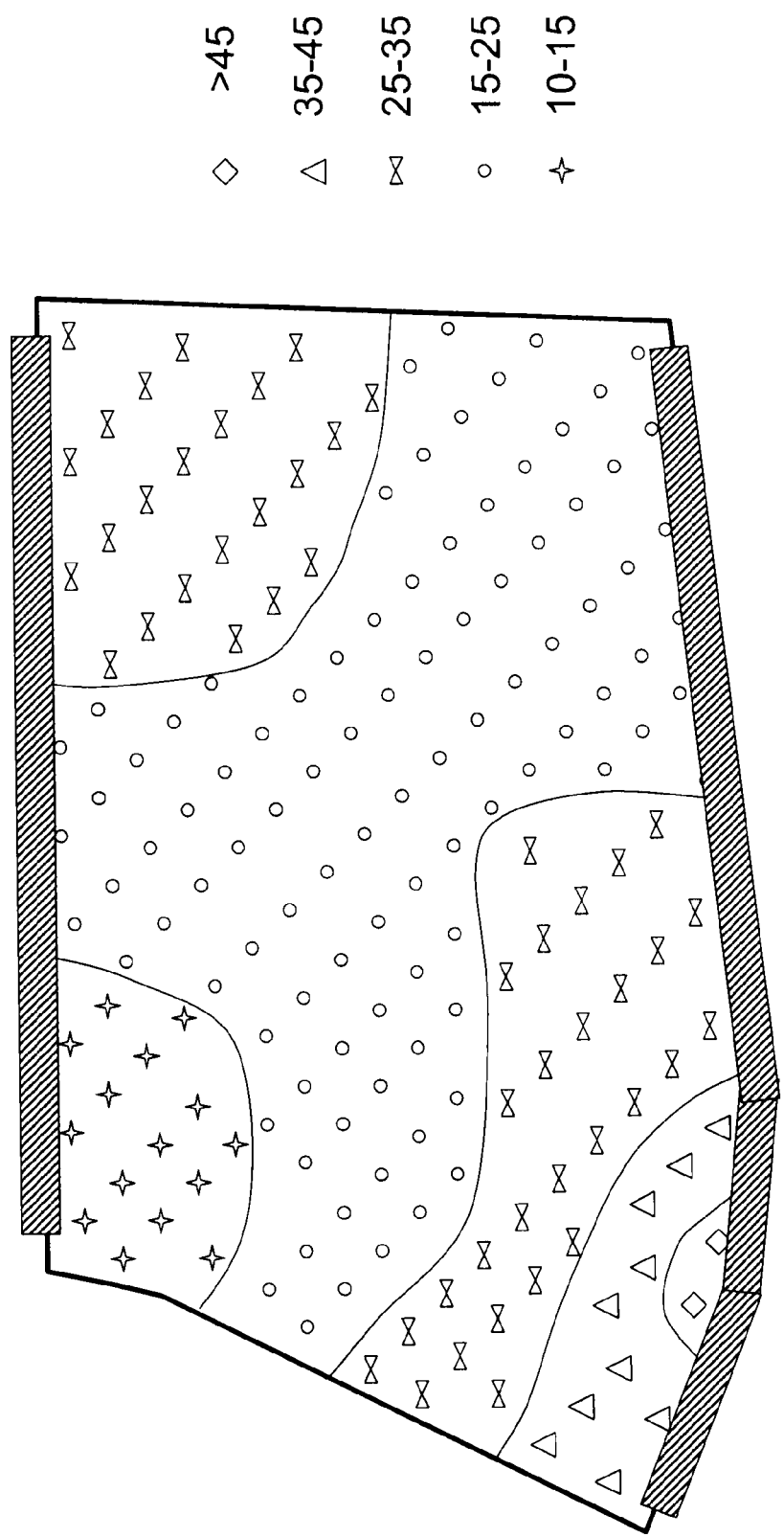
FIG. 2 is a diagram, of an airplane window, in which the sheet resistances (in ohms) obtained using the treatment according to the invention are indicated.

FIG. 2 is a diagram, of an airplane window, in which the sheet resistances (in ohms) obtained using the treatment according to the invention are indicated.

Figure 3:
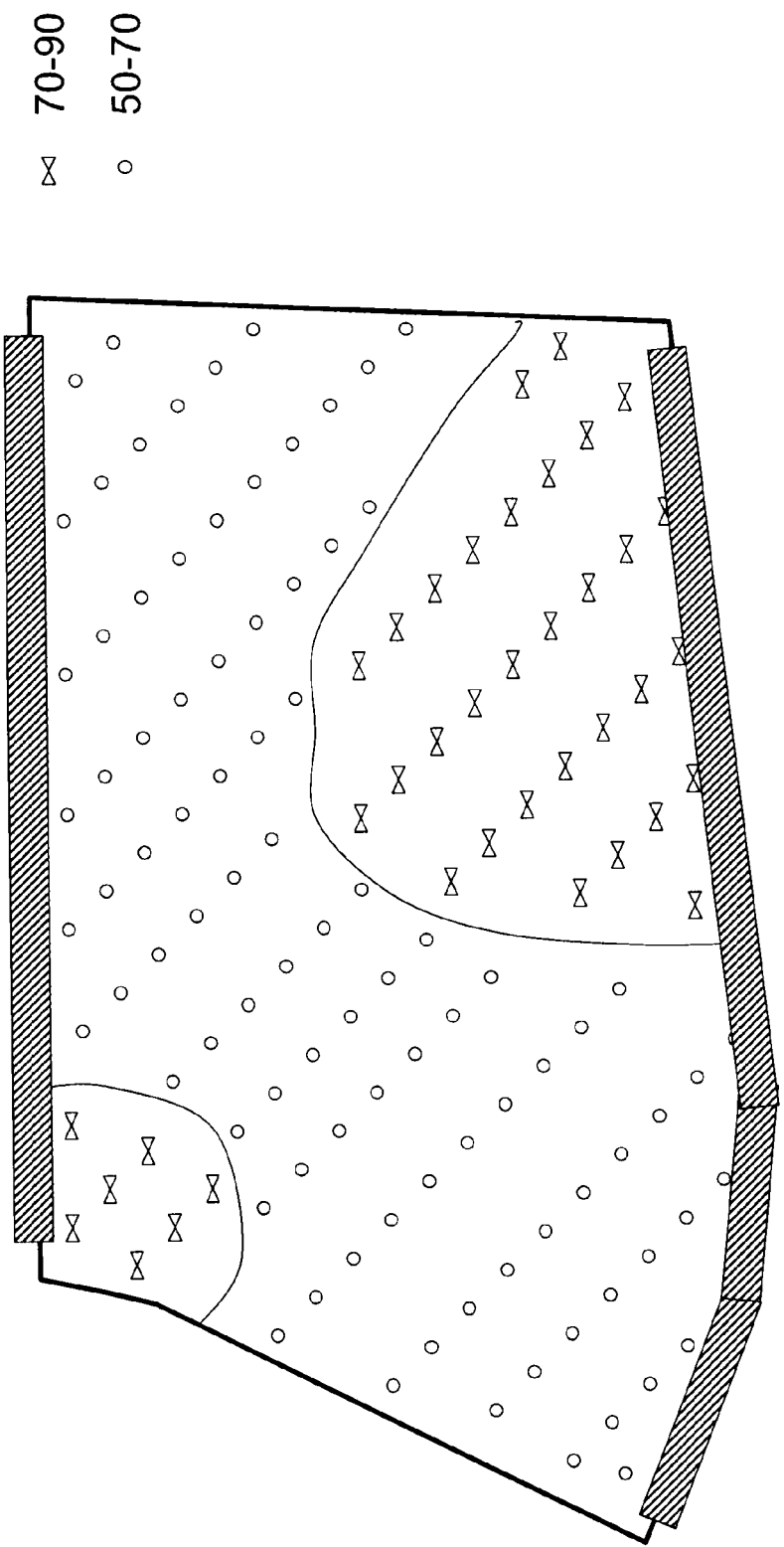
FIG. 3 shows the electrical power densities (in $W/dm^2$) obtained in the case of a heating film treated according to the invention in order to obtain the sheet resistances shown in FIG. 2.
Figure 4:
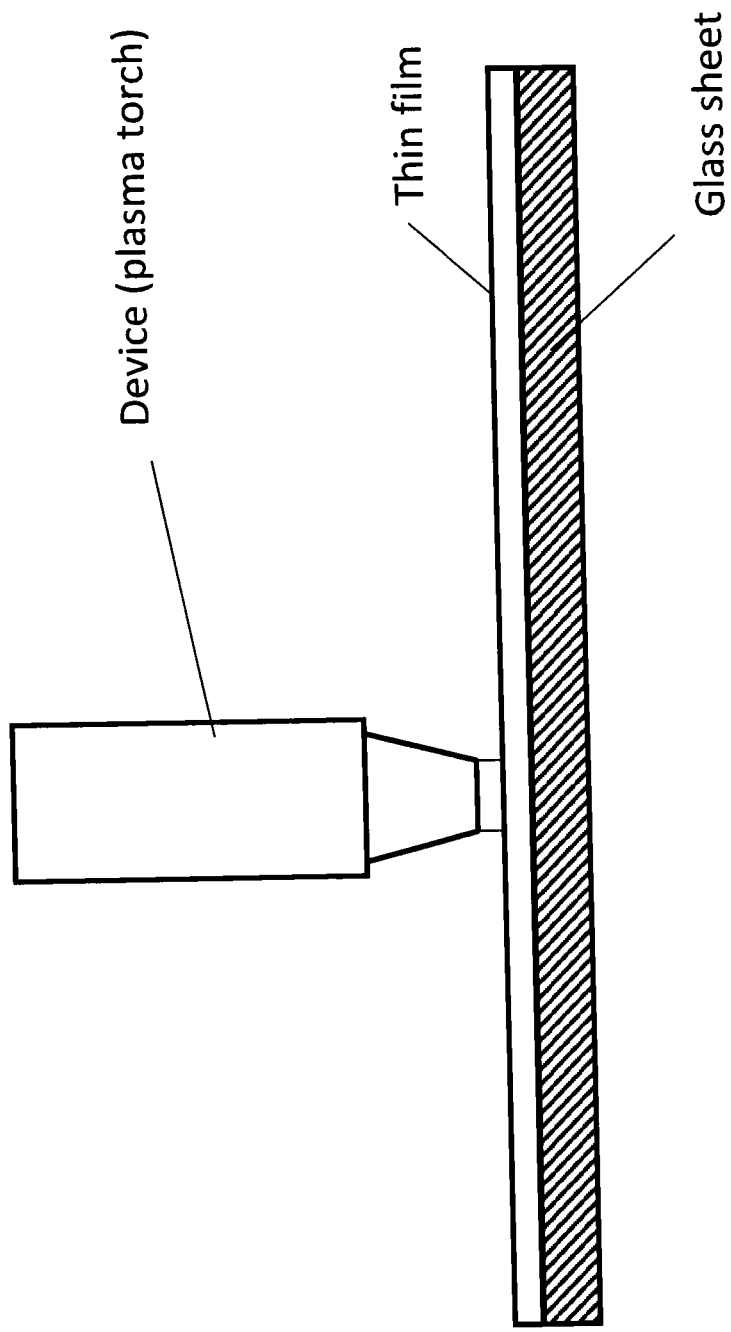
FIG. 4 shows a plasma device treating the coating deposited on the substrate.
Figure 5:
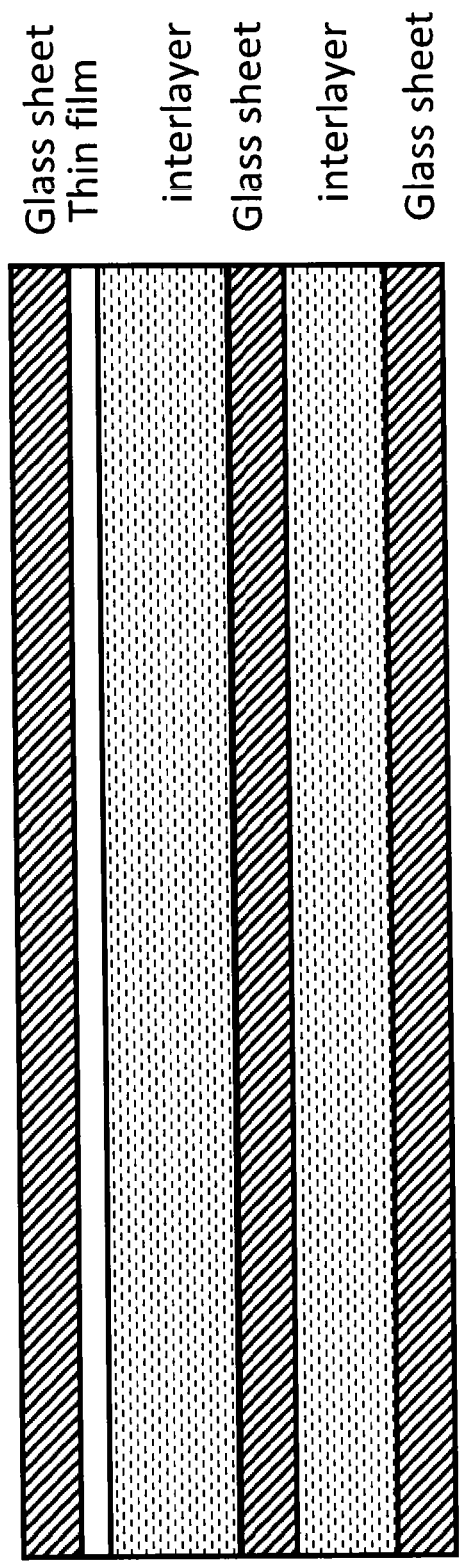
FIG. 5 shows a 3-glass pane glazing, with two interlayers and the thin film on film 2.

FIG. 3 shows the electrical power densities (in W/dm$^2$) obtained in the case of a heating film treated according to the invention in order to obtain the sheet resistances shown in FIG. 2.

The schematic of an airplane window shown in FIG. 1 comprises two electrical wires in the form of conductive strips (hashed in the diagram). The heating film, made of ITO, has a sheet resistance that is uniform over its entire area. As indicated in the diagram, the electrical power density that results therefrom is highly non-uniform: for a targeted power density of 70 W/dm$^2$, it is about 25 W/dm$^2$ in the bottom left-hand corner, whereas it exceeds 100 or even 150 W/dm$^2$ in the top left-hand corner. The ratio K of the average power density to the maximum power density is only 0.3.

The heated window in FIG. 2 comprises an ITO film treated according to the invention, such that its sheet resistance varies from one region to another. The sheet resistance gradient is illustrated by contours. From about 10 ohms in the top left-hand corner, the sheet resistance exceeds 30 ohms in the bottom left-hand corner. FIG. 3 shows that such a window is much more uniform in terms of electrical power density than the window in FIG. 1. In particular, the electrical power density does not exceed 90 W/dm$^2$, for a targeted average of 70 W/dm$^2$. The ratio K is about 0.75.

EXAMPLES

The examples that follow illustrate the invention without, however, limiting it.

Windows were produced by depositing an ITO (indium tin oxide) film on a 3 mm thick, chemically tempered glass sheet.

The film was sputtered, using an ITO target and a slightly (between 1 and 10%) oxygen-enriched argon plasma, at a deposition pressure between $9\times10^{-4}$ and $8\times10^{-3}$ mbar. The glass sheet was heated during the deposition. The sheet resistance of the thin film, uniform over the entire area of the film, was 10 ohms. The film was about 200 nm thick.

The thin film was then treated using a plasma torch sold by Plasmatreat under the reference RD 1004. The plasma feed gas was air. The electrical power was 1500 W, and the nozzle had a diameter of 2.5 cm, such that the resolution of the process was about 5 cm$^2$. Various regions of the film were treated under various conditions in order to obtain regions of differing sheet resistance. The speed of movement, the number of passes and the distance between the thin film and the nozzle were the parameters that were used to vary locally the sheet resistance of the film.

Table 1 below contains the results of the tests. Indicated are:
- the number of passes, denoted N;
- the speed of movement, denoted V, and expressed in cm/s;
- the distance between the nozzle and the film, denoted D, expressed in mm;
- light transmittance ($T_L$), absorbance ($A_L$) and reflectance ($R_L$) as specified in ISO standard 9050:2003, expressed in percent;
- the haze (corresponding to the ratio of the scattered transmittance to the total transmittance, integrated over the entire visible spectrum under illuminant D65), denoted H and expressed in percent; and the sheet resistance $R_c$ measured using the 4-point or Van der Pauw method, with a maximum spacing of 2 cm between the points.

TABLE 1

|    | N  | V  | D | $T_L$ | $R_L$ | $A_L$ | H   | $R_c$ |
|----|----|----|---|-------|-------|-------|-----|-------|
| C1 | —  | —  | — | 82.4  | 14.1  | 3.5   | 0.3 | 10    |
| 1  | 2  | 50 | 4 | 80.2  | 17.4  | 2.5   | 0.7 | 34    |
| 2  | 10 | 50 | 4 | 77.6  | 19.4  | 2.9   | 0.8 | 36    |
| 3  | 5  | 20 | 4 | 75.9  | 21.2  | 2.9   | 0.6 | 53    |
| 4  | 5  | 10 | 4 | 74.6  | 22.0  | 3.4   | 1.1 | 67    |
| 5  | 5  | 10 | 3 | 72.0  | 23.3  | 4.7   | 2.3 | 3000  |
| 6  | 2  | 10 | 2 | 73.6  | 23.1  | 3.3   | 2.7 | 55000 |

The reference C1 corresponds to an ITO film before treatment.

The results in Table 1 show that the most effective parameter for locally modulating the sheet resistance of the film is the distance between the nozzle and the film. The effect of the speed of movement is shown by comparing examples 3 and 4. The number of passes has little influence, as shown by comparing examples 1 and 2.

The plasma treatment slightly increased the light reflectance of the film, leading to a moderate and completely acceptable drop in the light transmittance. The light absorbance of the film was only affected a little by the treatment. Examples 5 and 6 show that very high resistances can be obtained with very small nozzle-film distances. Such resistances are not used in practice.

In any case, the thickness of the film was not modified by the treatment. Furthermore, examination by scanning electron microscope and by X-ray diffraction showed that the treatment according to the invention had not modified the crystallization characteristics of the film, for example the size of the crystals. Roughness measurements carried out using an atomic force microscope (AFM) demonstrated that the treatment according to the invention did not increase the roughness of the film, and therefore did not influence the adhesion of the conductive strips used as electrical wires, or the adhesion of any optional polymer lamination interlayers.

The ranges described above include all specific values and subranges therebetween.

This application claims priority to French application No. 1051140, filed on Feb. 17, 2010, and incorporated herein by reference in its entirety.

The invention claimed is:

1. A method of obtaining a heated window, comprising:
    depositing a continuous thin film of a transparent electronically conductive oxide, having a sheet resistance that is uniform over the entire area of the film, on a glass sheet; and
    subjecting the thin film to a plasma treatment in which a device that emits excited species of an oxygen plasma is placed facing a region of the thin film, and then a relative movement is created between the thin film and the device in order to treat differentially the various regions of the thin film, so that after the thin film has been treated it has regions with different sheet resistances,
    wherein the excited species of the oxygen plasma locally increases the resistivity of the film subjected to the plasma treatment, and
    wherein the transparent electronically conductive oxide comprises at least one member selected from the group consisting of indium tin oxide, aluminium- or gallium-doped zinc oxide and fluorine- or antimony-doped tin oxide.

2. The method according to claim 1, wherein the glass sheet is thermally or chemically tempered and retains its properties due to the tempering after the plasma treatment.

3. The method according to claim 1, wherein the regions of the thin film are differentially treated by varying at least one parameter chosen from: the distance between the thin film and the plasma device; the speed of relative movement between the thin film and the plasma device; the number of passes of the device facing the thin film; the electrical power of the plasma device; the flow rate of plasma feed gas; and the concentration of oxygen in the plasma feed gas.

4. The method according to claim 3, wherein the glass sheet is stationary and the device emitting excited species of an oxygen plasma can move in three dimensions, the device being automatically controlled so that it is possible to adjust the distance z between the nozzle of the device emitting excited species of an oxygen plasma and the thin film and/or the speed of the movement of the device emitting excited species of an oxygen plasma in the x-y plane of the glass sheet.

5. The method according to claim 1, wherein after plasma treatment, the ratio of the sheet resistance of the most resistive region to the sheet resistance of the least resistive region is between 2 and 30.

6. The method according to claim 1, wherein after plasma treatment, the sheet resistance varies in a range between 5 and 100 ohms depending on the region.

7. The method according to claim 1, wherein the transparent electronically conductive oxide is indium tin oxide.

8. The method according to claim 7, wherein the indium tin oxide contains between 5 and 10 at % of tin.

9. The method according to claim 1, wherein the transparent electronically conductive oxide is aluminium- or gallium-doped zinc oxide.

10. The method according to claim 1, wherein the transparent electronically conductive oxide is fluorine- or antimony-doped tin oxide.

11. The method according to claim 1, wherein the film is between 40 and 1250 nm thick.

12. The method according to claim 1, wherein before the film has been treated, its sheet resistance is between 2 and 50 ohms.

13. A heated window obtained by the method of claim 1.

14. A method of making the airplane of claim 10, comprising installing the heated window in an airplane.

15. A method of making the airplane of claim 11, comprising installing the heated window in an airplane.

* * * * *